(12) United States Patent
Genoulaz et al.

(10) Patent No.: US 9,903,902 B2
(45) Date of Patent: Feb. 27, 2018

(54) ELECTRICAL CONNECTOR FOR DETECTING DISCONTINUITIES IN AN ELECTRICAL NETWORK

(71) Applicant: LABINAL POWER SYSTEMS, Blagnac (FR)

(72) Inventors: Jerome Genoulaz, Seilh (FR); Serge Thierry Roques, Cornebarrieu (FR)

(73) Assignee: LABINAL POWER SYSTEMS, Blagnac (FR)

( * ) Notice: Subject to any disclaimer, the term of this patent is extended or adjusted under 35 U.S.C. 154(b) by 26 days.

(21) Appl. No.: 14/890,229

(22) PCT Filed: May 7, 2014

(86) PCT No.: PCT/FR2014/051068
§ 371 (c)(1),
(2) Date: Nov. 10, 2015

(87) PCT Pub. No.: WO2014/181066
PCT Pub. Date: Nov. 13, 2014

(65) Prior Publication Data
US 2016/0084900 A1    Mar. 24, 2016

(30) Foreign Application Priority Data
May 10, 2013    (FR) ...................................... 13 54226

(51) Int. Cl.
*G01R 31/02*    (2006.01)
*G01R 1/04*    (2006.01)
(Continued)

(52) U.S. Cl.
CPC ......... *G01R 31/026* (2013.01); *G01R 1/0416* (2013.01); *G01R 1/18* (2013.01); *G01R 31/008* (2013.01); *G01R 31/11* (2013.01)

(58) Field of Classification Search
CPC .... G01R 31/026; G01R 31/008; G01R 31/11; G01R 1/18; G01R 1/0416
See application file for complete search history.

(56) References Cited

U.S. PATENT DOCUMENTS 4,062,613 A * 12/1977 Tritenne ............... H01R 11/283
                                                      439/388
5,754,053 A     5/1998 Bourdeau
(Continued)

OTHER PUBLICATIONS

French Preliminary Search Report dated Jan. 23, 2014 in Patent Application No. FR1354226.
(Continued)

Primary Examiner — David M Gray
Assistant Examiner — Michael Harrison
(74) Attorney, Agent, or Firm — Oblon, McClelland, Maier & Neustadt, L.L.P.

(57) ABSTRACT

An electrical connection member capable of detecting discontinuities in an electrical network is provided. The connection member includes a casing having at least three branches, each of the branches including, at the end of same, at least one terminal for electrical connection to a respective piece of equipment, and least one main conductor linking two terminals at the ends of two branches in the casing, at least one secondary conductor linking at least one terminal of the end of the third branch in the casing, and including an electrical coupler designed to inject an electrical test signal from the secondary conductor into the main conductor, and to transmit, to the secondary conductor, an electrical response signal generated by the reflection of the electrical test signal against a discontinuity encountered in the electrical network.

15 Claims, 4 Drawing Sheets

(51) Int. Cl.
*G01R 31/00* (2006.01)
*G01R 31/11* (2006.01)
*G01R 1/18* (2006.01)

(56) References Cited

U.S. PATENT DOCUMENTS

| | | | |
|---|---|---|---|
| 2011/0063768 A1* | 3/2011 | Sexton | H02H 3/10 361/79 |
| 2011/0169498 A1* | 7/2011 | Shipley | G01R 31/11 324/527 |
| 2013/0182361 A1* | 7/2013 | Sexton | H02H 3/38 361/79 |

OTHER PUBLICATIONS

International Search Report and Written Opinion dated Jul. 16, 2014 in PCT/FR2014/051068.
Cynthia Furse, et al., "Frequency-Domain Reflectometery for on-Board Testing of Aging Aircraft Wiring" IEEE Transactions on Electromagnetic Compatibility, vol. 45, No. 2, XP011072800, May 1, 2003, pp. 306-315.

* cited by examiner

ELECTRICAL CONNECTOR FOR DETECTING DISCONTINUITIES IN AN ELECTRICAL NETWORK

GENERAL FIELD

The invention relates to the field of detection of faults in an electrical network, especially that of detection of discontinuities by reflectometry.

PRIOR ART

To detect a fault on an electrical conductor which transports a supply or datum signal, one solution is reflectometry. An electrical test signal is injected into the electrical conductor using a reflectometer. In the presence of a discontinuity in the electrical conductor, this test signal is partially reflected and returned to the reflectometer.

A conductor typically comprises a conductive core enclosed by an insulating sheath and comprises a contact (male or female) at each of its ends.

The electrical conductors in most electrical installations are grouped together to form a mono-wire, two-wire, three-wire cable, etc., and a plurality of cables is assembled in a harness.

At each of its ends, a harness therefore has a plurality of contacts intended to be electrically connected to a plurality of contacts of another equipment.

To inject a test signal, it generally proves necessary to disconnect one of the ends of the harness containing the electrical conductor to be tested to gain access to a contact of this conductor.

After disconnection of the connector, location of a fault by reflectometry and repair of the defective conductor, it is necessary to conduct operating test of the system or equipment which was electrically connected to the defective conductor but also on all systems and equipment whereof the supply conductors pass through the connector uncoupled by the fault.

Also, intermittent faults can appear in an electrical installation subject to vibrations, for example in the power supply network of an aircraft. But these intermittent faults therefore cannot be detected during tests conducted while the aircraft is undergoing maintenance on the ground.

To avoid such disconnections, it has been proposed to utilise current induction injection clamps.

FIG. 1 shows an injection clamp P known from the prior art. The clamp P is adapted to clamp an electrical cable to be tested by reflectometry. The clamp emits coupling by electromagnetic radiation to the clamped conductor and generates a test signal which spreads to the conductor. However, this type of clamp is not adapted for testing harnesses of cables provided with electromagnetic protections, which do not let this radiation pass between the exterior and the interior of the cable. These protections must be removed prior to the test, or even destroyed if the design of the protections has not planned for this possibility; this extends the duration and magnifies the cost of intervention.

Also, harnesses can comprise a large number of electrical cables held clamped to each other. However, the introduction of a clamp such as that illustrated in FIG. 1 risks damaging conductors adjacent to that intended to be tested: first the cables are generally joined together by a fret or a pipe clamp which has to be cut (first damage risk), and also the conductors then have to be pulled away and the injection clamp has to be placed (second damage risk).

The clamps such as the clamp P cannot be placed on twisted cables, for example two-wire, three-wire, etc., without untwisting the cable by having previously pulled out and then reseated the contact of the connector.

PRESENTATION OF THE INVENTION

The aim of the invention is to conduct tests involving injection of a signal into an electrical network without having to disconnect or damage any element of the electrical network.

For this purpose an electrical connector is proposed, characterized in that it is capable of detection of discontinuities in an electrical network and comprises:
- a body having at least three branches, each of the branches comprising at its end at least one terminal for electrical connection to a respective equipment,
- at least one primary conductor connecting in the body two terminals to the ends of two branches,
- at least one secondary conductor connecting in the body at least one terminal of the end of the third branch and comprising an electrical coupler adapted to inject into the primary conductor an electrical test signal originating from the secondary conductor, and to transmit to the secondary conductor an electrical response signal generated by reflection of the electrical test signal on a discontinuity found in the electrical network.

The invention especially conducts tests by simple connecting of a reflectometer to a secondary end of the member, and therefore reduces the cost and duration of a detection test for faults such as short circuits or open circuits.

Also, the member conducts reflectometry tests on an electrical line when operating. This is particularly advantageous as discontinuities can appear in some electrical installations subject to perturbations when they are operating, for example in the electrical supply network of an aircraft. The connector detects discontinuities occurring during aircraft flight, or even discontinuities appearing only intermittently, which are very difficult or even impossible to detect during ground testing.

The invention also relates to a kit for detection of discontinuities in an electrical network, the kit comprising an electrical connector as per the preceding description and a reflectometer electrically connected to at least one terminal of a secondary end of the member.

DESCRIPTION OF FIGURES

Other characteristics, aims and advantages of the invention will emerge from the following description which is purely illustrative and non-limiting and which must be considered in conjunction with the appended drawings, in which.

In all figures, similar elements have identical reference numerals.

DETAILED DESCRIPTION OF THE INVENTION

Figure 1:
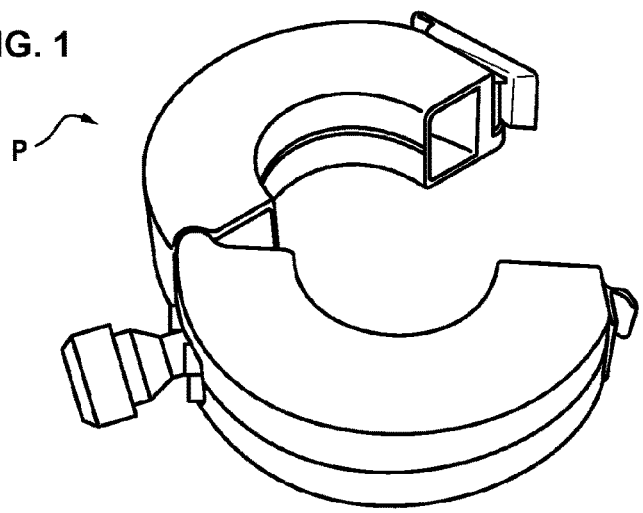
FIG. 1, already discussed, illustrates an injection clamp known from the prior art.
Figure 2:
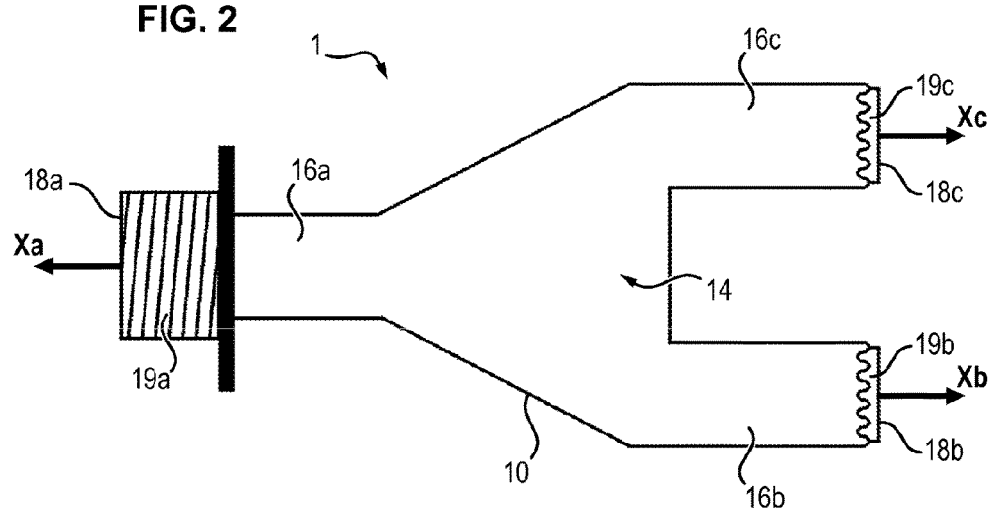
FIG. 2 is an exterior side view of an electrical connector according to a first embodiment.

In reference to FIG. 2, an electrical connector 1 for equipment comprises an body 10.

The body 10 ensures electromagnetic and/or mechanical and/or lightning and/or hermetic protection of elements housed in the inner housing 12.

In the embodiment illustrated in FIG. 2, the body 10 has a central portion 14 and several tubular branches 16a-16c.

Each branch 16a-16c extends from the central portion 14 to an end 18a-18c of the member 1 intended to be connected to a respective equipment. The ends have respective connecting axes of parallel directions.

A first branch 16a extends from the central portion 14 in a direction Xa. A second branch 16b and a third branch 16c extend from the central portion 14 in directions Xb, Xc opposite the direction Xa of the first branch 16a, forming a Y-shaped body 10.

Each end 18a-18c comprises at least one terminal or electrical connection contact 182a-182c.

Of the ends of the member 1, two at least are called primary ends, and one at least is called secondary.

Each primary end 18a, 18b is intended to be electrically connected by means of terminals to a respective electrical equipment A, B.

The secondary end 18c is intended to be electrically connected by means of terminals to a device 2 configured to detect discontinuities in the network R, for example a reflectometer.

Figure 3:
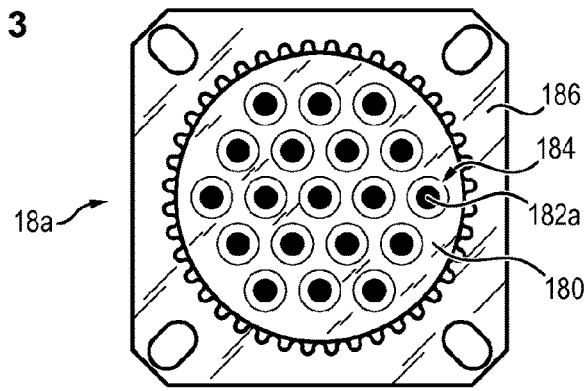
FIG. 3 is a frontal view of an end of the electrical connector of FIG. 2.

According to an embodiment illustrated in FIG. 3, each primary end 18a, 18b has a planar and substantially circular transversal surface 180. The connecting terminals 182a are distributed over the planar surface 180, and can form a housing or else protrude relative to the planar surface. Each terminal 182 is adapted to be electrically connected with an element of complementary volume present on an equipment (not illustrated) intended to be connected to the member 1.

The secondary end 18c can be made similarly.

Also, each end 18a-18c can comprise complementary mechanical connecting means 19 to keep in place the electrical link set up between each terminal 182a-182c of the member 1 and each complementary element of the corresponding connected equipment.

For example, the end has a bezel forming a base and an outer thread. The thread is intended to receive a complementary plug while the bezel is intended to fix the connector to a structure or equipment.

Figure 4:
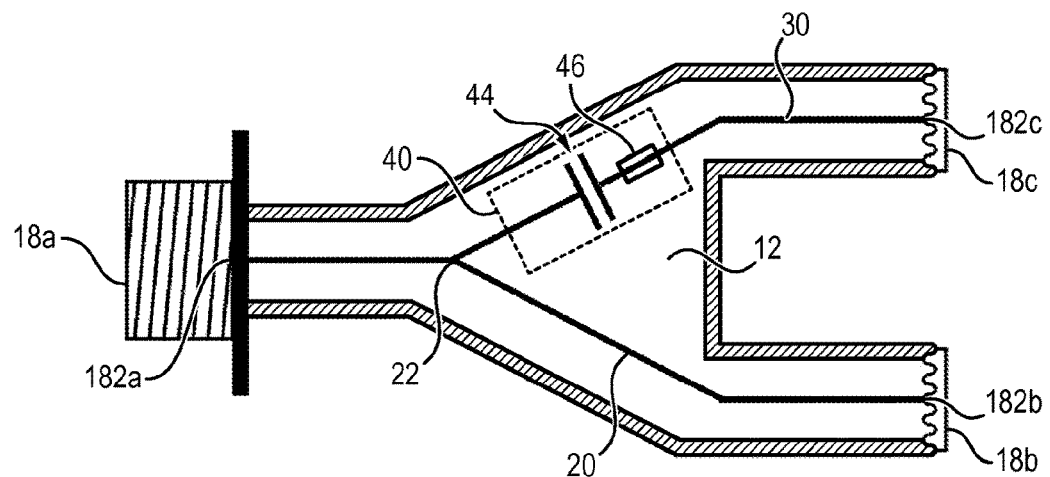
FIG. 4 is a sectional view of the electrical connector shown in FIG. 2.

In reference to FIG. 4, the member 1 also comprises an inner housing 12 connected to each end of the member 1.

The member 1 comprises at least two electrical conductors 20, 30 extending in the inner housing 12. Each electrical conductor can typically be a cable comprising a core and a protective sheath extending about the core.

The member 1 comprises at least one primary conductor 20 connecting a first primary terminal 182a of a first primary end 18a, with a second terminal 182b of a second primary end 18b. Each primary conductor 20 is provided to transport an electrical signal between the first terminal 182a and the second terminal 182b.

The member 1 also comprises at least one secondary conductor 30 housed in the inner housing 12. The secondary conductor 30 is connected both to at least one secondary terminal 182c present on a secondary end 18c of the member 1, and also to an electrical coupler 40 also housed in the inner housing 12. Each secondary conductor 30 is provided to transport an electrical signal between a corresponding secondary terminal 182c and a coupler 40.

In the embodiment illustrated in FIG. 4 showing a Y-shaped body 10, the end 18a opposite the ends 18b and 18c is a primary end 18a, 18b. Each electrical coupler 40 is associated with a primary conductor 20.

Each coupler 40 is adapted to inject into the associated primary conductor 20 an electrical test signal originating from the connected secondary conductor 30.

Each coupler 40 is also adapted to detect a test signal which transits in a primary conductor 20, and to transmit the third electrical signal to the connected secondary conductor 30 as far as the corresponding secondary terminal.

Figure 6:
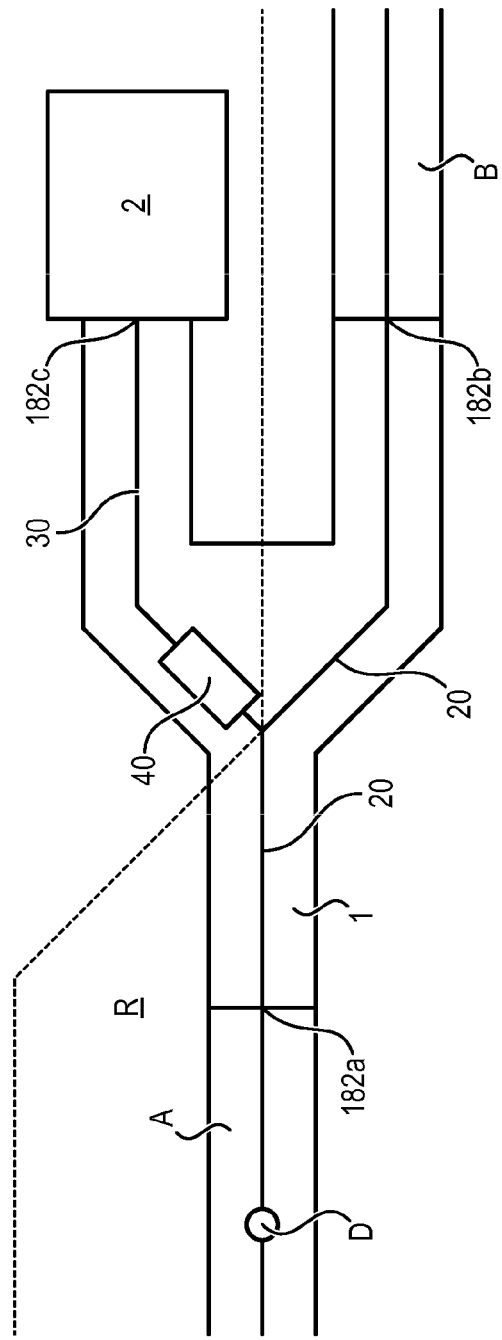
FIG. 6 schematically illustrates an electrical network tested by reflectometry using an electrical connector according to the invention.

In an embodiment illustrated in FIGS. 4 and 6, the member 1 comprises a primary conductor 20, a secondary conductor 30 connected to a coupler 40, which coupler 40 is linked to the primary conductor 20.

More precisely, the coupler of the embodiment illustrated in FIG. 4 is a capacitive coupler comprising a condenser 44 directly connected to a junction point 22 of the primary conductor 20, for example by welding. The condenser 44 can typically be a film or tantalum condenser.

The electrical coupler 40 can also comprise a filter 46 adapted to let through the electrical test and response signals, and to filter a functional electrical signal which transits over a primary conductor 20. The filter 46 can be for example a high-pass filter 46 adapted to filter a low-frequency functional signal which transits via the primary conductor 20.

The filter 46 can be a component placed on the secondary conductor, upstream or downstream of the condenser 44. In another embodiment, not illustrated, the condenser and the filter are one and the same component; the condenser is adapted to ensure the filtering described. The member 1 can be used to detect faults in an electrical network.

In reference to FIG. 6, the member 1 is electrically connected to a first equipment A by its first primary end 18a, to a second equipment B by its second primary end 18b. A common electrical network R comprising at least the devices A, B and the primary conductor 20 of the member 1 is created.

The member 1 is also electrically connected by its secondary end 18c to a device 2 intended to detect discontinuities in the common network R, such as a reflectometer.

The member 1 and the reflectometer 2 together constitute a kit for detecting discontinuities in the electrical network R.

In a first detection mode, none of the first and second equipment A, B connected to the member 1 delivers an electrical signal to the member 1; no functional electrical signal transits over the primary conductor 20 of the member 1.

At the start of the test, the reflectometer 2 delivers an electrical test signal to the secondary terminal 182c to which it is connected.

This electrical test signal is transported to the secondary electrical conductor 30, then injected into the primary conductor 20 at the junction point 22 by means of the coupler 40.

The test signal spreads to the first primary terminal 182a, then to the first connected equipment A; it also propagates to the second primary terminal 182b, in the connected second equipment B.

The test signal finds a discontinuity D in the network R (here present in the first equipment A). Some of the energy of the test signal is reflected by the discontinuity D, generating an electrical response signal in the direction of the junction point 22.

The electrical reflected response signal reaches the junction point 22, is transmitted to the secondary conductor 30 by means of the coupler 40, reaches the secondary terminal 182c and is finally captured by the connected reflectometer 2.

In a second detection mode, the equipment are operating: a functional electrical signal circulates in the common network R.

This functional signal comes from one of the first or second equipment A or B; it can be for example a supply signal generated by the first connected equipment A, or a data signal.

If the coupler 40 comprises a filter 46 such as described previously, the functional signal is not transmitted to the secondary conductor 30. The secondary conductor 30, and the device 2 connected at the secondary end 18c, are therefore insulated from the functional electrical signal.

When the reflectometer 2 delivers an electrical test signal, this test signal is injected into the primary conductor 20 via the coupler 40 and is superposed on the functional electrical signal.

Also, the response signal reflected by the presence of a discontinuity in the common network is also superposed to the functional electrical signal.

The response signal is transmitted by the electrical coupler 40 to the secondary conductor 30, then to the reflectometer, but not the functional signal which is filtered so as not to damage the reflectometer.

Figure 5A:
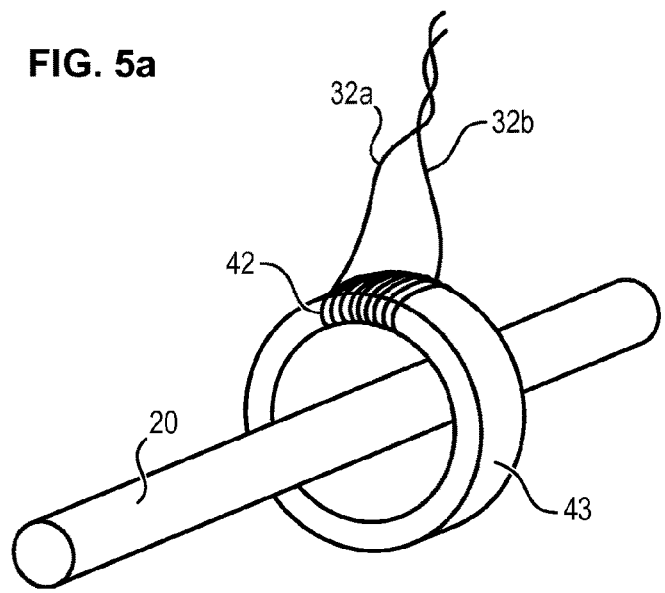
FIG. 5a is a perspective view of a coupler according to a second embodiment.
Figure 5B:
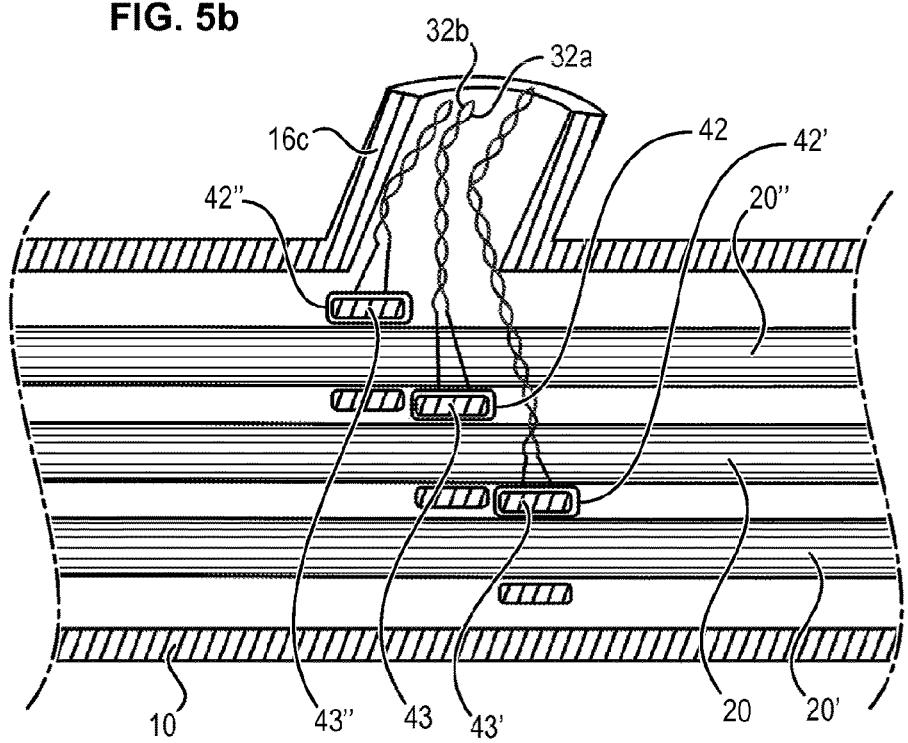
FIG. 5b is a view in partial section of an electrical connector comprising couplers according to the second embodiment.

In another embodiment illustrated in FIGS. 5a and 5b, the coupler 40 is an inductive coupler. Although not illustrated, the inductive coupler can comprise a filter 46 such as described previously.

The inductive coupler 40 comprises a winding 42 and a magnetic element 43.

The magnetic element 43 extends right around a portion of a primary conductor 20. It typically has a toric form.

The secondary conductor 30 is a wire comprising a portion wound according to a direction of rotation about a portion of the magnetic element 43, the wound portion forming a winding 42.

The conductor also comprises two portions of wire 32a, 32b each joined to the winding 42 and to a secondary terminal 182c of the secondary end 18c.

When a test signal output by the reflectometer reaches the winding 42, the winding 42 creates a magnetic field channeled by the magnetic element 43. The circulation of this field about the primary conductor 20 creates an electrical test signal which propagates to the primary conductor 20.

When an inductive coupler is used there is no transmission of electrical signal by contact at a welding point, but by radiation (coupling).

The inductive coupler is preferably configured to create a magnetic field of orientation parallel to the primary conductor 20 to improve transmission of electrical signal by coupling. For this to happen, a magnetic element 43 of toric form can be arranged so that its axis is parallel to the primary conductor, and the winding can be wound around the magnetic element in a direction substantially parallel to the primary conductor.

If the primary conductor 20 comprises a core protected by a sheath, there is no need to strip this sheath at any junction point to ensure electrical communication between the winding 42 and the primary conductor 20, since the sheath of the primary conductor 20 is adapted to be traversed by the electromagnetic radiation emitted by the winding 42.

The two portions of wire 32a, 32b of each secondary conductor 30 can be twisted together to prevent couplings by crosstalk between several secondary conductors.

In the embodiment illustrated in FIG. 5b, the member comprises three primary conductors 20, 20', 20", three respective windings 42, 42', 42", and three respective magnetic elements 43, 43', 43".

The primary conductors 20, 20', 20" extend parallel in the inner housing 12.

In the illustrated embodiments, each coupler 40 is associated with a respective single primary conductor 20. A test signal delivered by the device 2 will therefore test one electrical line only.

In another embodiment, each coupler 40 can be associated with several primary conductors. So one and the same test signal sent by a reflectometer will spread to several primary conductors, which reduces the duration of the test.

For example, a winding 42 as per the second embodiment can enclose several primary conductors, and send out electromagnetic radiation which will reach all the enclosed primary conductors.

The connector 1 can be used in an electrical network embedded in an aircraft, or in any other type of installation subject to the appearance of intermittent or permanent discontinues.

The functional signal can be a supply signal.

Supply signals presently used in aircraft are of continuous frequency, or between 360 Hz and 800 Hz, typically 400 Hz. In this context, the filter 46 can have a capacity of 33 nF whereof the cutoff frequency is 100 kHz. The filter 46 will let through test and response signals whereof the frequency is greater than 100 kHz and will block the frequency supply signal less than 100 kHz.

In an embodiment, the functional signal can be a data signal. In this case, the coupler 40 and the filter 46 if present will be dimensioned to exhibit impedance which does not perturb the transmission of data.

Each secondary end 18c can be permanently connected to a reflectometer 2 which could be regularly requested to detect discontinuities in the common electrical network, for example during flight of an aircraft.

In an embodiment, each secondary end 18c can be intermittently connected to a reflectometer 2. In this case, the member 1 can comprise removable mechanical and/or electrical insulation means 17 placed on the secondary end 18c to prevent the introduction of dust, fluid, etc. via the secondary terminals in the member 1 and secure the electrical installation when no device 2 is connected to the secondary end 18c.

These insulation means 17 can be adapted to cooperate with the mechanical connecting means 19 present on the secondary end 18c. For example, the insulation means are caps and the mechanical connecting means are threads on the outer surface of the body 10.

The member 1 can of course have more than one secondary branch and more than two principal branches 16a, 16b.

Also, in the embodiments of body 10 in a Y-shape illustrated in the figures, the first branch extending in the direction Xa is a primary end 18a, 18b. In another embodiment, the end 18a opposite the two other ends can be a secondary end 18c.

Other orientations of branches for a member 1 having three branches 16a-16c are also possible, for example a T-shape (in which the axes connecting two branches are joined), or else a star shape having three branches (each connecting axis forms an angle of 120° with each of the two other connecting axes).

The invention claimed is:

1. An electrical connector capable of detection of discontinuities in an electrical network and comprising:
   a body comprising a first terminal able to be connected to a first equipment part of the electrical network, a second terminal able to be connected to a second equipment part of the electrical network, and a third terminal able to be connected to a reflectometer distinct from the first and second equipment parts of the electrical network;
   at least one electrical coupler in the body;
   a primary conductor connecting the first terminal to the second terminal; and
   at least one secondary conductor connecting the third terminal to the electrical coupler,
   wherein the electrical coupler is adapted to inject into the primary conductor an electrical test signal input in the electrical connector through the third terminal then transmitted by the secondary conductor, and to transmit to the secondary conductor then to the third terminal an electrical response signal generated by reflection of the electrical test signal on a discontinuity found in the electrical network, then input in the electrical connector through the first terminal or the second terminal.

2. The electrical connector according to claim 1, wherein each electrical coupler is a capacitive coupler.

3. The electrical connector according to claim 2, wherein each electrical coupler comprises a film or tantalum condenser connected to a junction point of the primary conductor by welding.

4. The electrical connector according to claim 1, wherein each electrical coupler is an inductive coupler.

5. The electrical connector according to claim 4, wherein each electrical coupler comprises a magnetic element extending about a portion of the primary conductor, and each secondary conductor is a wire comprising a portion of wire wound about a portion of the corresponding magnetic element thus forming a winding, and two portions of wire each joining the winding to the third terminal.

6. The electrical connector according to claim 5, wherein the two portions of wire of each secondary conductor together form a twist.

7. The electrical connector according to claim 1, wherein each electrical coupler comprises a high-pass filter adapted to let the electrical test and response signals pass through, and adapted to filter a low-frequency functional electrical signal which transits over the corresponding primary conductor.

8. The electrical connector according to claim 1, further comprising a removable cap adapted to cover the third terminal.

9. The electrical connector according to claim 8, wherein the cap comprises an electrical insulator.

10. The electrical connector according to claim 8, wherein an end of the body to which the third terminal is connected comprises a thread, the cap being adapted to be screwed onto the thread.

11. The electrical connector according to claim 1, wherein the body comprises at least one of an electromagnetic protection and anti-lightning protection.

12. A detection kit for detecting discontinuities in an electrical network, the kit comprising:
   an electrical connector according to claim 1; and
   a reflectometer electrically connected to the third terminal.

13. An electrical network comprising:
   an electrical connector according to claim 1; and
   first and second equipment parts of the electrical network, the first equipment part of the electrical network being electrically connected to the first terminal, and the second equipment part of the electrical network being connected to the second terminal.

14. The electrical network according to claim 13 for a supply network, wherein the electrical supply network is provided on an aircraft.

15. A method for detecting discontinuities in an electrical network for supply network of aircraft comprising:
   electrically connecting first and second equipment parts of the electrical network with the first and second terminals of an electrical connector according to claim 1;
   electrically connecting a reflectometer with the third terminal of the electrical connector;
   generating, by the reflectometer, an electrical test signal towards the secondary conductor;
   injecting the electrical test signal into the primary conductor originating from the secondary conductor; and
   transmitting to the secondary conductor an electrical response signal generated by reflection of the electrical test signal on a discontinuity found in the electrical network.

* * * * *